United States Patent [19]
Mueller

[11] 3,965,287
[45] June 22, 1976

[54] ELECTRIC CIRCUIT ENCLOSURE TRANSFORMER MOUNTING MEANS

[75] Inventor: Dale A. Mueller, St. Paul, Minn.

[73] Assignee: Honeywell Inc., Minneapolis, Minn.

[22] Filed: Feb. 24, 1975

[21] Appl. No.: 552,099

[52] U.S. Cl. .............................. 174/66; 174/52 R; 220/266; 336/67
[51] Int. Cl.² ......................................... H05K 5/03
[58] Field of Search ............. 336/98, 105, 107, 65, 336/67, 68; 174/53, 54, 56, 66, 52 R; 220/3.2, 3.8, 3.3, 265, 266

[56] References Cited
UNITED STATES PATENTS

| | | | |
|---|---|---|---|
| 1,064,033 | 6/1913 | Wagner | 220/266 |
| 1,295,168 | 2/1919 | Hooker | 220/266 |
| 1,604,516 | 10/1926 | Jacobsen | 220/3.8 |
| 1,721,775 | 7/1929 | Fallon | 336/67 X |
| 1,850,165 | 3/1932 | Barnett | 220/266 |
| 2,211,690 | 8/1940 | Edwards | 336/107 X |
| 2,433,511 | 12/1947 | Goddard | 174/52 R |
| 2,672,578 | 3/1954 | Verkuil | 336/67 X |
| 2,819,331 | 1/1958 | Bladh | 174/52 R |
| 2,943,137 | 6/1960 | Van Wyngarden | 174/61 |
| 3,136,523 | 6/1964 | Munroe | 174/52 R |
| 3,144,503 | 8/1964 | Fischer | 174/52 R |

Primary Examiner—Thomas J. Kozma
Attorney, Agent, or Firm—Alfred N. Feldman

[57] ABSTRACT

A mounting plate adapted to mount a transformer on an electric circuit enclosure. The mounting plate is provided with a dual function knockout arrangement so that the transformer to be mounted can either be surface mounted with different types of mounting means, or can be recessed into the plate by the removal of the entire knockout portion.

5 Claims, 6 Drawing Figures

ELECTRIC CIRCUIT ENCLOSURE TRANSFORMER MOUNTING MEANS

BACKGROUND OF THE INVENTION

It has been common practice in the electrical wiring trade to mount transformers, such as low voltage bell and control transformers, on electric junction boxes or on covers for electric junction boxes. The mounting arrangement provides for connecting the line voltage portion of the transformer within the junction box, while leaving the low voltage or control portion of the transformer external to the junction box. In some cases it has been possible to mount the transformer directly through a knockout in the side of a conventional junction box. In other cases, there is not sufficient space for this type of mounting where the transformer is of a larger capacity needed for many control applications, such as heating and air conditioning control. In these cases, the control transformer has been mounted on top of a conventional octagon, 2 × 4 or 4 × 4 box. In some cases, the transformer has been mounted on a flat plate-like member that forms an enclosure for the electric junction box by providing an opening in the cover that is annular in configuration and which accepts either a mounting spud that forms part of the transformer end bell or accepts some other type of mounting means that clamps the end bell of the transformer into the hole in the mounting plate. In some cases the transformer is manufactured with the mounting plate as an integral part of the transformer, and with the transformer recessed into an opening in the plate.

The different types of mounting configurations have in the past required an assortment of different types of transformers and mounting plates. In some cases where the transformer is surface mounted on the plate through a hole, the amount of room taken by the transformer outside of the electric enclosure has been excessive. To overcome this, there has been manufactured a line of transformers in which the transformer is recessed into the plate and where the transformer and plate are sold as an integral unit. These arrangements require an installer to stock a number of different transformers and plate configurations in order to accomplish the end result of mounting a low voltage control transformer in a system in a manner that is compatible to the space available.

SUMMARY OF THE INVENTION

The present invention is directed to a unique mounting plate adapted to mount a control transformer in a variety of fashions on an electrical enclosure or junction box. The unique mounting plate contains a portion which has been upset to form a knockout and where the upset portion is of a shape to accommodate the end bell of a companion control transformer. The control transformer is supplied with a mounting means attached to the transformer so that the transformer can either be surface mounted through an annular portion of the knockout or can be recessed into the plate by the removal of the entire knockout portion. With this arrangement, the installer can carry a single transformer and mounting plate, but will have the option available to him of mounting the transformer in various configurations depending upon the space available.

The simplification of the stocking problem for the installer creates a distinct cost advantage in being able to stock or carry a much more limited variety of components and yet accomplish the same job as would be accomplished by carrying two or three different types of transformers and plate configurations as is currently the practice.

DESCRIPTION OF THE PREFERRED EMBODIMENT

Figure 1:
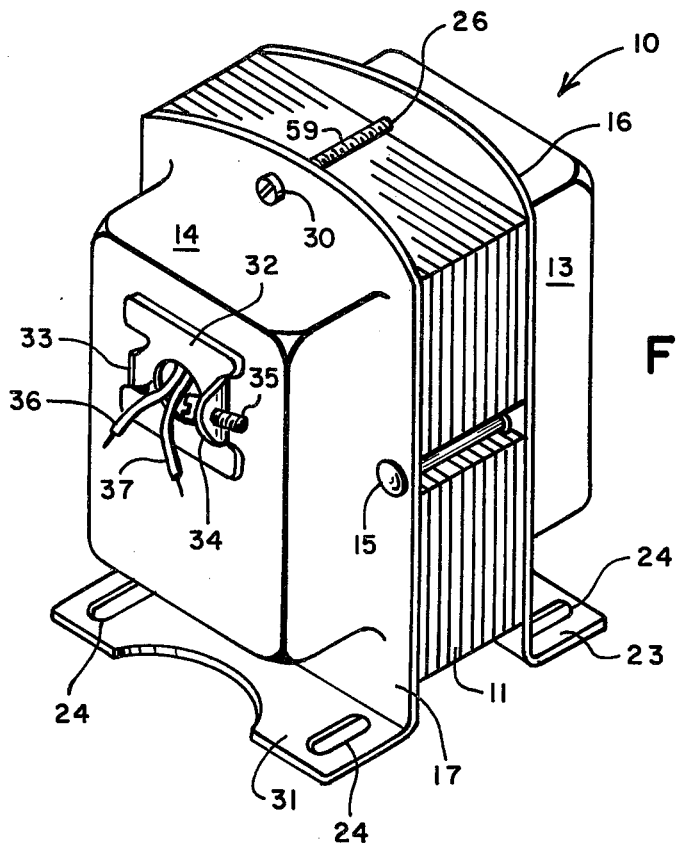
FIG. 1 is an isometric view of a conventional control transformer having provisions for the unique mounting means of the present invention.
Figure 2:
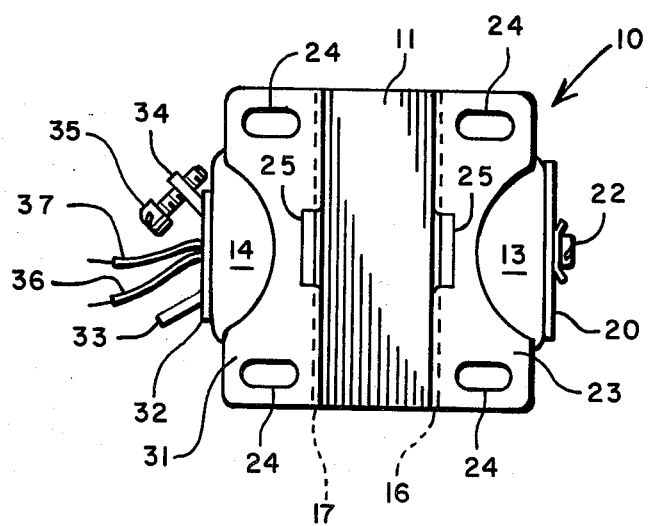
FIG. 2 is a bottom view of the transformer of FIG. 1.

In FIGS. 1 and 2 there is disclosed a low voltage control type of transformer 10. The transformer is made up of a conventional magnetic core 11 encircled by coil means 12 (FIG. 4), which is protected in and enclosed by a pair of end bells 13 and 14. The end bells 13 and 14 are generally of the same shape and are held in an assembled relationship with the core 11 and the coil means 12 by a pair of rivets 15 which pass through flange means 16 and 17 of the respective end bells 13 and 14.

The end bell 13 further is provided with a terminal board 20 and a pair of terminals 21 and 22 (FIG. 4) for the low voltage wiring from the coil means 12. The end bell 13 further includes as an extension of the flange 16, a foot mounting means 23 that has a pair of openings 24 so that the foot means 23 can be used for mounting the transformer 10. Included in the flange 16 of the end bell 13 is an opening 25 which is used for mounting the transformer means 10 in connection with the present invention. The end bell 13 further has an opening 26 in the flange 16 that is designed to accept a bolt as part of the mounting means for the transformer 10, as will become apparent in connection with FIG. 4.

Figure 4:
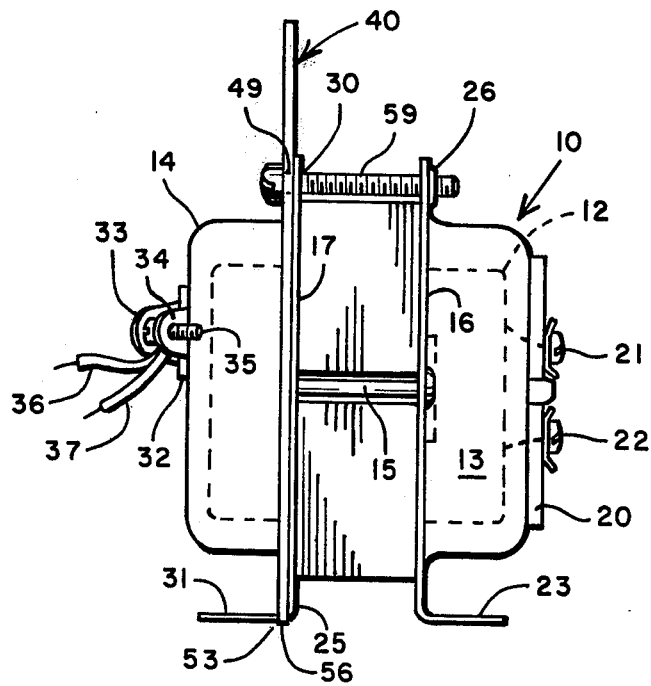
FIG. 4 is a side view of the plate and transformer mounted in a three quarter recessed mode.

The end bell 14 has as part of its flange 17 a hole 30 that cooperates with the threaded opening 26 in the mounting configuration disclosed in FIG. 4. The end bell 14 also has as part of the flange 17 a foot means 31 with openings 24 and 25 to provide for the mounting of the transformer 10. The end bell 14 further has as part of the mounting means a mounting device 32 that is made up of a bracket having an upstanding portion 33 along with a second upstanding portion 34 and a screw 35. Mounting device 32 may be attached to the end bell 14 by an eyelet to allow device 32 to swivel, if desired. The upstanding portion 33 and the upstanding portion 34 are manufactured to project into a conventional round knockout hole with the screw 35 locking the mounting means 32 into position thereby mounting the transformer in a conventional manner on a knockout hole. In this configuration, a pair of conductors 36 and 37 would project through the knockout hole into an electric circuit enclosure where the conductors 36 and 37 could be connected into a line voltage circuit for energizing the control transformer 10. The mounting means 32 may be attached to the end bell 14 so that it can swivel thereby allowing the mounting of the transformer 10 in any position on a mounting plate, as will be disclosed in connection with FIG. 5. The flange 17 has the opening 25 as did flange 16 to cooperate to form part of the mounting means as will become apparent in connection with the description of FIG. 4.

Figure 3:
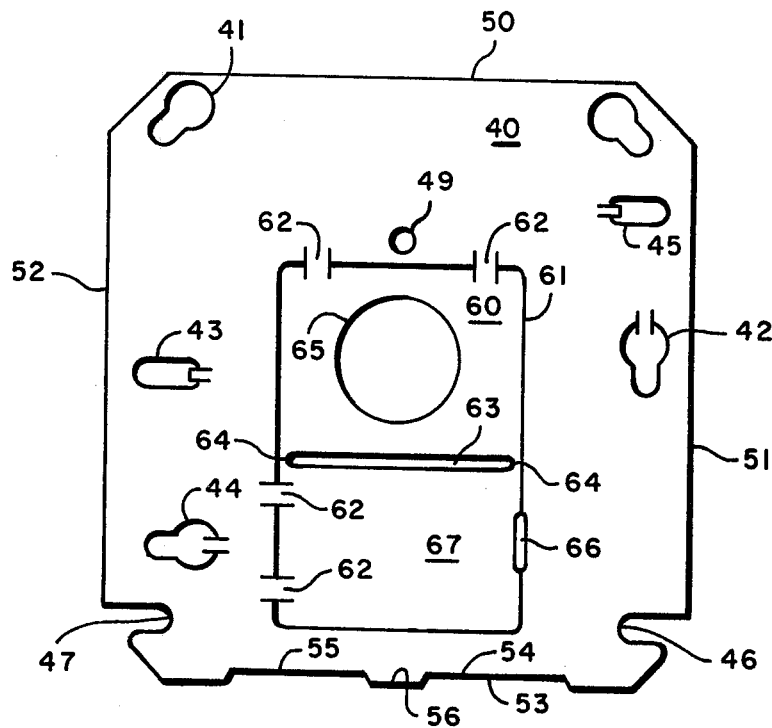
FIG. 3 is a plane view of the novel mounting means or plate which is adapted to mount the transformer of FIGS. 1 and 2.

In FIG. 3, a mounting means 40 is disclosed in the form of a generally square, flat member designed to cover either a conventional 2 × 4, 4 × 4, or an octagon box to form an electric circuit enclosure. The plate-like cover means 40 has a number of mounting holes 41, 42, 43, 44 and 45, which cooperate with the mounting slots 46 and 47 to make the plate-like cover means 40 adaptable for mounting on various enclosures such as an octagon box, 2 × 4 box, or 4 × 4 box.

The sides 50, 51 and 52 of the plate-like cover means 40 are generally flat while a fourth side 53 has two recessed portions 54 and 55 to provide a projection 56 that is used as part of the mounting means for the present invention. This will become apparent when the projection 56 is disclosed in connection with FIG. 4 as falling in a slot 25 in the flange 17 of the transformer 10.

The plate-like cover means 40 has an upset portion 61 which has an outline which is generally rectangular in form to correspond to the outline or shape of the end bell 14 of the transformer 10. The upset portion 61 forms a knockout that is held in place by a plurality bridge member 62, as is conventional in the manufacture of knockouts in electrical boxes. In the present knockout 61, a slot is provided at 63 that substantially divides the knockout into two portions 60 and 67, and provides a means so the upper portion 60 can be conveniently pried out as a step in removing the entire knockout portion 61. In the present disclosure, the two portions are generally equal in size and have small bridging portions 64 at each end. Bridging portions 64 are scored to assist the bridging portions to separate (fracture) during prying out the upper portion 60. These bridging portions 64 are formed to hold the knockout in place as a unitary knockout 61 when the plate-like cover means 40 is used for surface mounting of a transformer. Also provided in the knockout 61 is an annular opening 65 which can be a conventional round knockout or can be a hole punched through the plate 40. If the hole or annular portion 65 is left as a knockout, the plate-like cover means 40 can be used as a box cover as well as a transformer mounting means. If the annular portion 65 is removed during the initial manufacture of the plate-like mounting means 40, the hole resulting can be used for surface mounting the transformer as will be shown in connection with FIGS. 5 and 6, or will be removed with the knockout means 61 when used as a mounting means in connection with the disclosure of FIG. 4.

A further slot 66 is provided in the lower half 67 of the knockout means 61 so that the lower portion 67 can be conveniently pried out as a step in removing the entire knockout portion when it is desired to mount the transformer 10 in a recessed mode in the plate-like cover means 40.

FIG. 4 discloses the transformer means 10 recessed into the plate-like cover means 40. The flange 17 has its opening 25 in line with the projection 56 of the mounting plate 40 to act like a tongue and groove arrangement to lock the bottom edge 53 of the mounting plate 40 into the mounting foot 31 of the flange 17 of the end bell 14. The knockout 61 has been removed in its entirety and the end bell 14 passes through the opening formed by the removal of the knockout 61. A mounting means 59 in the form of a bolt is provided and the bolt 59 passes through the alignment opening 30 in the flange 17 of the end bell 14. At the same time, the fastening means or bolt 59 passes through a hole 49 in the plate-like mounting means 40 and is secured in the opening 26 of the end bell flange 16. The combination of the fastening arrangement of the bolt 59 and the tongue and groove arrangement of the projection 56 in the slot 25 mounts the transformer 10 in a recessed mode on the plate 40 so that approximately ¼ of the transformer would project into the electric circuit enclosure or junction box upon which the plate 40 is mounted. This reduces the projecting height of the transformer 10 substantially and is convenient for use in locations where room is at a premium.

Figure 5:
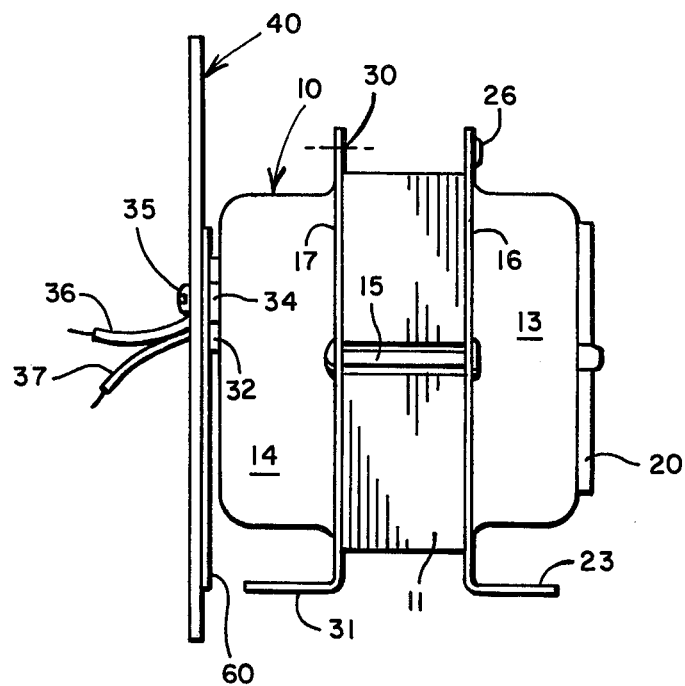
FIG. 5 is a side view of the transformer in a surface mounted mode on the same mounting plate of FIG. 3.

In FIG. 5 the same transformer 10 is disclosed mounted on plate 40 by use of the mounting means 32 which included the flange 33, and the flange 34 and bolt 35. It can thus be seen that the annular opening 65 has been utilized in conjunction with the mounting means 32 to surface mount the transformer 10 on the mounting plate 40 by passing the mounting means portion 32 through the annular opening 65 and locking the transformer into place without removing the knockout means 61. In this configuration the entire transformer is mounted external to the electric circuit enclosure while the wires 36 and 37 project into the electric circuit enclosure for connection in a line voltage circuit.

Figure 6:
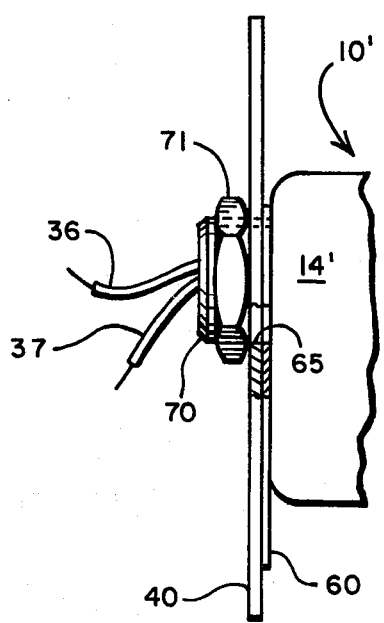
FIG. 6 is a partial side view of a transformer having an end bell with an integral spud mounted on the plate of FIG. 3.

In FIG. 6 a modified transformer configuration is disclosed. The transformer 10' is disclosed having an end bell 14' that has a different type of mounting means than previously disclosed. The mounting means 70 is a threaded spud that is formed into the end bell 14' and projects through the annular opening or hole 65 in the plate-like mounting means 40. The threaded spud 70 has the wires 36 and 37 projecting from the center and is held in place by a nut 71 that is tightened onto the threaded spud 70 and against the plate means 40. This is a conventional mounting technique for mounting a spud type transformer on the surface of a mounting plate through an annular opening. Once again, in this particular configuration the knockout means 61 is left in tact, but the single plate disclosed in FIG. 3 has been adapted for use with a further type of mounting means than disclosed in FIGS. 4 and 5.

It can thus be seen that the single plate-like cover means 40 can provide for a multiple arrangement of mountings for transformers on electric circuit enclosures. The various types of mounting means that are used with the plate can be conventional such as the mounting spud, or the mounting means 32 that projects through the annular opening 65. The unique plate-like cover means, however, provides a two-part knockout 61 that allows for a recessed mounting mode as opposed to the surface mounting mode and allows the installer to carry a single plate and transformer to meet the various mounting problems that confronts the installer in the field. This allows the installer to reduce the number of components that he carries thereby reducing overall costs and adding convenience in the installation of low voltage wiring for control and other purposes.

It is obvious that the multiple knockout configuration and mounting plate could be adapted with various mounting means to lock a transformer to the mounting plate. For this reason the applicant wishes to be limited in the scope of his invention solely by the scope of the appended claims.

The embodiments of the invention in which an exclusive property or right is claimed are defined as follows:

1. Mounting means adapted to mount a transformer on an electric circuit enclosure, including: plate-like cover means for covering said enclosure to effectively contain and protect electric wiring within said enclosure; said plate-like cover means having upset portion means forming knockout means removable to form an opening in said cover means adapted to receive a portion of said transformer to aid in the mounting of said transformer on said cover means; said upset portion means having an open slot with two opposed and spaced surfaces that substantially divides said knockout means into two parts; said two parts being joined together by bridging portions; said knockout means conforming in shape to the shape of the transformer to be mounted thereon to allow said transformer to be partially recessed into said enclosure; and said knockout means further including an annular portion within said knockout means to provide an annular aperture for surface mounting of said transformer if said knockout means is not removed in its entirety from said cover means.

2. Mounting means adapted to mount a transformer as described in claim 1 wherein said two parts are substantially the same size and wherein said slot facilitates the removal of the knockout means when said cover means is used to mount a transformer in a recessed mode.

3. Mounting means adapted to mount a transformer as described in claim 2 wherein one of said parts includes said annular portion as an open hole adapted to surface mount a transformer.

4. Mounting means adapted to mount a transformer as described in claim 2 wherein said plate-like cover means is a flat member of a size to cover said electric circuit enclosure.

5. Mounting means adapted to mount a transformer as described in claim 1 wherein said bridging portions are scored to facilitate the removal of said knockout means.

* * * * *